US010825488B1

(12) United States Patent
Yun (10) Patent No.: US 10,825,488 B1
(45) Date of Patent: Nov. 3, 2020

(54) DATA SENSING CIRCUIT OF SEMICONDUCTOR APPARATUS

(71) Applicant: SK hynix Inc., Icheon-si (KR)

(72) Inventor: Min Ho Yun, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/710,958

(22) Filed: Dec. 11, 2019

(30) Foreign Application Priority Data

May 14, 2019 (KR) .................. 10-2019-0056323

(51) Int. Cl.
*G11C 7/00* (2006.01)
*G11C 7/06* (2006.01)
*H03K 5/007* (2006.01)
*G11C 8/12* (2006.01)

(52) U.S. Cl.
CPC .................. *G11C 7/06* (2013.01); *G11C 8/12* (2013.01); *H03K 5/007* (2013.01)

(58) Field of Classification Search
CPC ............. G11C 7/06; G11C 8/12; H03K 5/007
USPC .......................................................... 365/205
See application file for complete search history.

(56) References Cited

U.S. PATENT DOCUMENTS

| 9,099,169 B1* | 8/2015 | Morton .................. G11C 7/062 |
| 2009/0108929 A1 | 4/2009 | Yan | |
| 2015/0155014 A1* | 6/2015 | Giridhar .................. G11C 7/12 365/189.09 |

FOREIGN PATENT DOCUMENTS

KR 101859121 B1 5/2018

OTHER PUBLICATIONS

Christian C. Enz et al., Circuit Techniques for Reducing the Effects of Op-Amp Imperfections: Autozeroing, Correlated Double Sampling, and Chopper Stabilization, Proceedings of the IEEE, Nov. 1996, pp. 1584-1614, vol. 84, No. 11, IEEE.

Sanghoon Hong et al., Low-Voltage DRAM Sensing Scheme With Offset-Cancellation Sense Amplifier, IEEE Journal of Solid-State Circuits, Oct. 2002 pp. 1356-1360, vol. 37, No. 10, IEEE.

\* cited by examiner

*Primary Examiner* — Huan Hoang
(74) *Attorney, Agent, or Firm* — William Park & Associates Ltd.

(57) ABSTRACT

In accordance with the present disclosure, a data sensing circuit of a semiconductor apparatus includes a sensing portion configured to sense and amplify an input signal provided through an activated data line between a first data line and a second data line. The data sensing circuit also includes an offset sampling portion configured to generate a second offset voltage by sampling a first offset voltage of one to be activated between the first data line and the second data line and configured to store the second offset voltage into a parasitic capacitor of the other one between the first data line and the second data line.

7 Claims, 12 Drawing Sheets

FIG.6C

DATA SENSING CIRCUIT OF SEMICONDUCTOR APPARATUS

CROSS-REFERENCES TO RELATED APPLICATION

The present application claims priority under 35 U.S.C. § 119(a) to Korean application number 10-2019-0056323, filed on May 14, 2019, in the Korean Intellectual Property Office, which is incorporated herein by reference in its entirety as set forth in full.

BACKGROUND

1. Technical Field

Various embodiments of the present disclosure relate to a semiconductor circuit and, more particularly, to a data sensing circuit of a semiconductor apparatus.

2. Related Art

A semiconductor apparatus includes a data sensing circuit configured to sense and amplify data stored in a memory cell. Degraded operational performance can occur due to a decrease in a sensing margin of a data sensing circuit, which may be caused by a change in fabrication process, usage of a power voltage having a low voltage level, and a decrease in capacitance of a capacitor configuring a unit memory cell.

SUMMARY

Various exemplary embodiments of the present disclosure may provide a data sensing circuit of a semiconductor apparatus capable of increasing a sensing margin.

In one embodiment of the present disclosure, a data sensing circuit of a semiconductor apparatus may include a sensing portion configured to sense and amplify an input signal provided through an activated data line between a first data line and a second data line. The data sensing circuit may also include an offset sampling portion configured to generate a second offset voltage by sampling a first offset voltage of one to be activated between the first data line and the second data line and configured to store the second offset voltage into a parasitic capacitor of the other one between the first data line and the second data line.

In one embodiment of the present disclosure, a data sensing circuit of a semiconductor apparatus may include a sense amp configured to generate a second offset voltage by sampling a first offset voltage of one to be activated between a first data line and a second data line, store the second offset voltage into the other one between the first data line and the second data line, and control the first offset voltage and the second offset voltage such that the first offset voltage is cancelled by the second offset voltage, in response to a plurality of control signals. The data sensing circuit may also include a sense amp control circuit configured to generate the plurality of control signals in response to an activation information defining one to be activated between the first data line and the second data line.

BRIEF DESCRIPTION OF THE DRAWINGS

Features, aspects and embodiments are described in conjunction with the attached drawings, in which.

DETAILED DESCRIPTION

Hereinafter, a semiconductor apparatus according to the present disclosure is described below with reference to the accompanying drawings through various embodiments.

Figure 1:
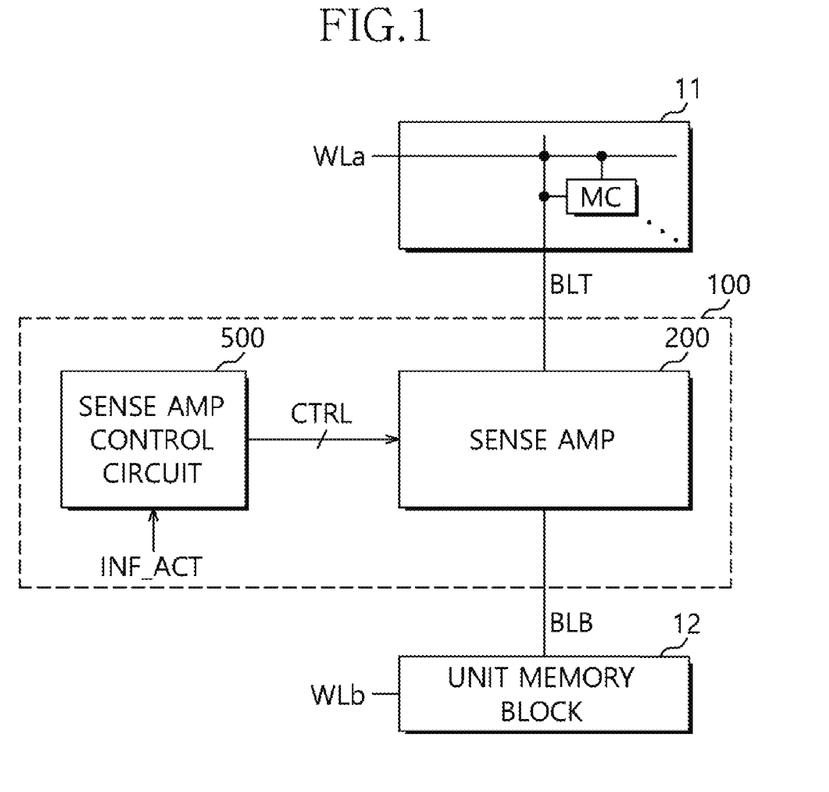
FIG. 1 is a schematic diagram illustrating a configuration of a data sensing circuit in accordance with an embodiment of the present disclosure.

FIG. 1 is a schematic diagram illustrating a configuration of a data sensing circuit in accordance with an embodiment of the present disclosure.

Referring to FIG. 1, the data sensing circuit 100 in accordance with an embodiment of the present disclosure may include a sense amp 200 and a sense amp control circuit 500.

The sense amp 200 may precharge a first data line and a second data line to a level of a precharge voltage VBLP in response to a plurality of control signals CTRL.

In response to the plurality of control signals CTRL, the sense amp 200 may generate a second offset voltage by sampling a first offset voltage of one to be activated between the first data line and the second data line; store the second offset voltage into the other one between the first data line and the second data line; and control the first offset voltage and the second offset voltage such that the first offset voltage is cancelled by the second offset voltage during an operation of sensing and amplifying the activated data line.

The first data line and the second data line may be data lines among various data lines utilized within a semiconductor apparatus. An embodiment of the present disclosure exemplifies, as the first data line and the second data line, bit lines respectively coupled to unit memory blocks 11 and 12.

Hereinafter, the bit lines electrically coupled to the unit memory blocks 11 and 12 are referred to as a first bit line BLT and a second bit line BLB, respectively.

The unit memory block 11 may be one unit region among unit regions discriminated from one another within a whole memory region.

A plurality of word lines WL and a plurality of first bit lines BLT may be disposed within the unit memory block 11. The unit memory block 11 may include memory cells MC electrically coupled to the plurality of word lines WL and the plurality of first bit lines BLT.

The unit memory block 12 may have the same configuration as the unit memory block 11.

The sense amp control circuit 500 may generate the plurality of control signals CTRL in response to an activation information INF_ACT.

The activation information INF_ACT may include an information capable of defining one to be activated between the first data line and the second data line. That is, the activation information INF_ACT may include an information capable of defining an activated one between the unit memory blocks 11 and 12. For example, the activation information INF_ACT may include an address signal, a decoded active command and/or so forth.

The sense amp control circuit 500 may independently control activation/deactivation timings of each of the plurality of control signals CTRL in response to the activation information INF_ACT, which will be described later with reference to following figures (for example, FIGS. 3 and 5).

Figure 2:
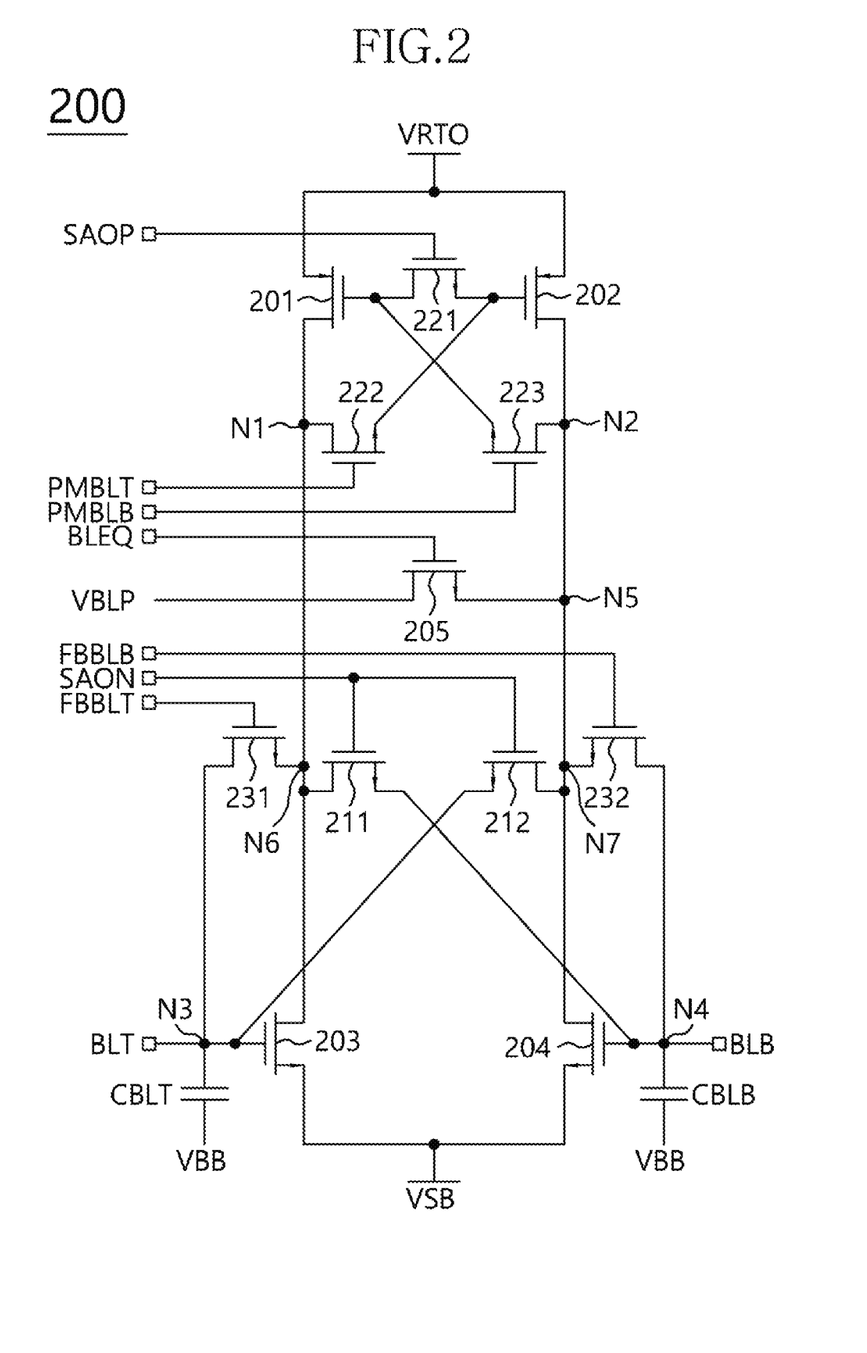
FIG. 2 is a schematic diagram illustrating a configuration of a sense amp illustrated in FIG. 1.

FIG. 2 is a schematic diagram illustrating a configuration of the sense amp illustrated in FIG. 1.

Referring to FIG. 2, the sense amp 200 may include a sensing portion and an offset sampling portion.

The plurality of control signals CTRL provided from the sense amp control circuit 500 may include signals BLEQ, SAON, SAOP, PMBLT, PMBLB, FBBLT, and FBBLB.

The sensing portion may sense and amplify an input signal provided through an activated one between the first bit line BLT and the second bit line BLB.

The sensing portion may include first to fifth switching elements 201 to 205.

The first switching element 201 may be electrically coupled to a node of a first voltage VRTO at its source and may be electrically coupled to a first node N1 at its drain.

The second switching element 202 may be electrically coupled to the node of the first voltage VRTO at its source and may be electrically coupled to a second node N2 at its drain.

The third switching element 203 may be electrically coupled to a node of a second voltage VSB at its drain; may be electrically coupled to the first node N1 at its source; and may be electrically coupled to a third node N3 at its gate, the third node N3 being electrically coupled to the first bit line BLT.

The fourth switching element 204 may be electrically coupled to the node of the second voltage VSB at its drain; may be electrically coupled to a second node N2 at its source; and may be electrically coupled to a fourth node N4 at its gate, the fourth node N4 being electrically coupled to the second bit line BLB.

The fifth switching element 205 may be electrically coupled to a fifth node N5 at its drain, the fifth node N5 being disposed between the second node N2 and the source of the fourth switching element 204; may be electrically coupled to a node of the precharge voltage VBLP at its source; and may receive the signal BLEQ among the plurality of control signals CTRL at its gate.

The offset sampling portion may generate the second offset voltage by sampling the first offset voltage of one to be activated between the first bit line BLT and the second bit line BLB; store the second offset voltage into a parasitic capacitor of the other one between the first bit line BLT and the second bit line BLB; and control the first offset voltage and the second offset voltage such that the first offset voltage is cancelled by the second offset voltage during an operation of sensing and amplifying the activated data line.

The offset sampling portion may include sixth to twelfth switching elements 211, 212, 221, 222, 223, 231, and 232.

The sixth switching element 211 may be electrically coupled to a sixth node N6 at its source, the sixth node N6 being disposed between the first node N1 and the source of the third switching element 203; may be electrically coupled to the fourth node N4 at its drain; and may receive the signal SAON among the plurality of control signals CTRL at its gate.

The seventh switching element 212 may be electrically coupled to a sixth node N7 at its source, the sixth node N7 being disposed between the second node N2 and the source of the fourth switching element 204; may be electrically coupled to the third node N3 at its drain; and may receive the signal SAON among the plurality of control signals CTRL at its gate.

The eighth switching element 221 may be electrically coupled to a gate of the first switching element 201 at its source; may be electrically coupled to a gate of the second switching element 202 at its drain; and may receive the signal SAOP among the plurality of control signals CTRL at its gate.

The ninth switching element 222 may be electrically coupled to the first node N1 at its source; may be electrically coupled to the gate of the second switching element 202 at its drain; and may receive the signal PMBLT among the plurality of control signals CTRL at its gate.

The tenth switching element 223 may be electrically coupled to the second node N2 at its source; may be electrically coupled to the gate of the first switching element 201 at its drain; and may receive the signal PMBLB among the plurality of control signals CTRL at its gate.

The eleventh switching element 231 may be electrically coupled to the third node N3 at its source; may be electrically coupled to the sixth node N6 at its drain; and may receive the signal FBBLT among the plurality of control signals CTRL at its gate.

The twelfth switching element 232 may be electrically coupled to the fourth node N4 at its source; may be electrically coupled to the seventh node N7 at its drain; and may receive the signal FBBLB among the plurality of control signals CTRL at its gate.

In FIG. 2, a first parasitic capacitor CBLT might not be a physical circuit but an equivalent circuit representing a capacitor parasitizing the first bit line BLT itself; and a second parasitic capacitor CBLB might not be a physical circuit but an equivalent circuit representing a capacitor parasitizing the second bit line BLB itself.

Figure 3:
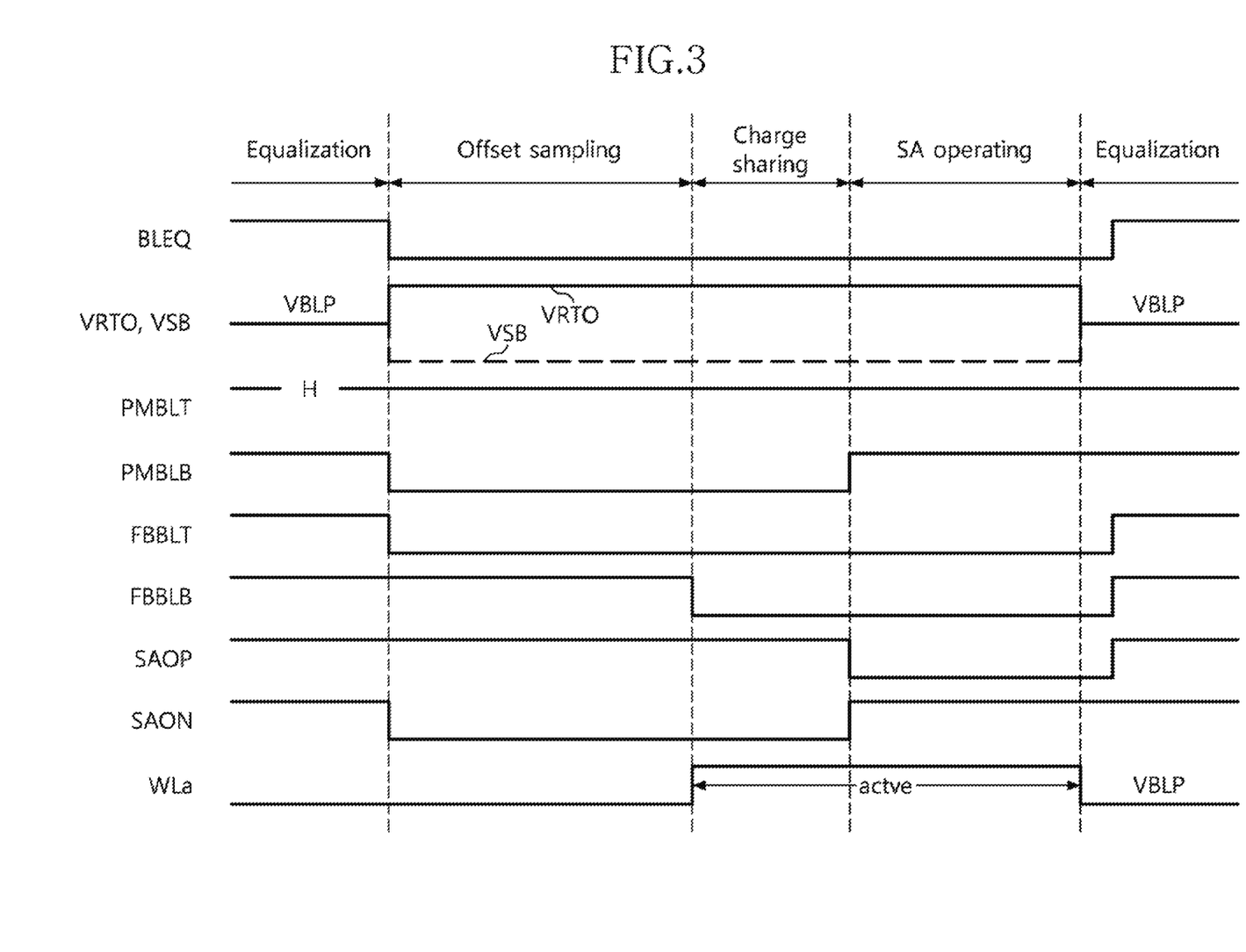
FIG. 3 is a timing diagram illustrating an operation of a data sensing circuit in accordance with an embodiment of the present disclosure.

FIG. 3 is a timing diagram illustrating an operation of a data sensing circuit in accordance with an embodiment of the present disclosure; and FIGS. 4A to 4D are schematic diagrams illustrating circuit connection statuses, for respective operation sections, within the data sensing circuit in accordance with an embodiment of the present disclosure.

In accordance with an embodiment of the present disclosure, a whole operation of the data sensing circuit 100 may be divided into a plurality of sections, for example, an equalization section Equalization, an offset sampling section Offset sampling, a charge sharing section Charge Sharing, and a sensing/amplification section SA operation.

The sense amp control circuit 500 may control, in response to the activation information INF_ACT, the activation/deactivation timings of each of the plurality of control signals CTRL to have different values within a whole section.

After the sensing/amplification section SA operation, the equalization section Equalization may start again in order to sense data after the sensing/amplification section SA operation.

FIG. 3 illustrates changes of the plurality of control signals CTRL within the respective sections when the unit memory block 11 is activated between the unit memory blocks 11 and 12 illustrated in FIG. 1 (i.e., when the first bit line BLT is activated). Hereinafter, described with reference to FIGS. 3 to 4D will be an operation of the data sensing circuit 100 in accordance with an embodiment of the present disclosure.

When the first bit line BLT is activated, the deactivated second bit line BLB may be utilized as a reference for sensing and amplifying a voltage level of the first bit line BLT.

Figure 4A:
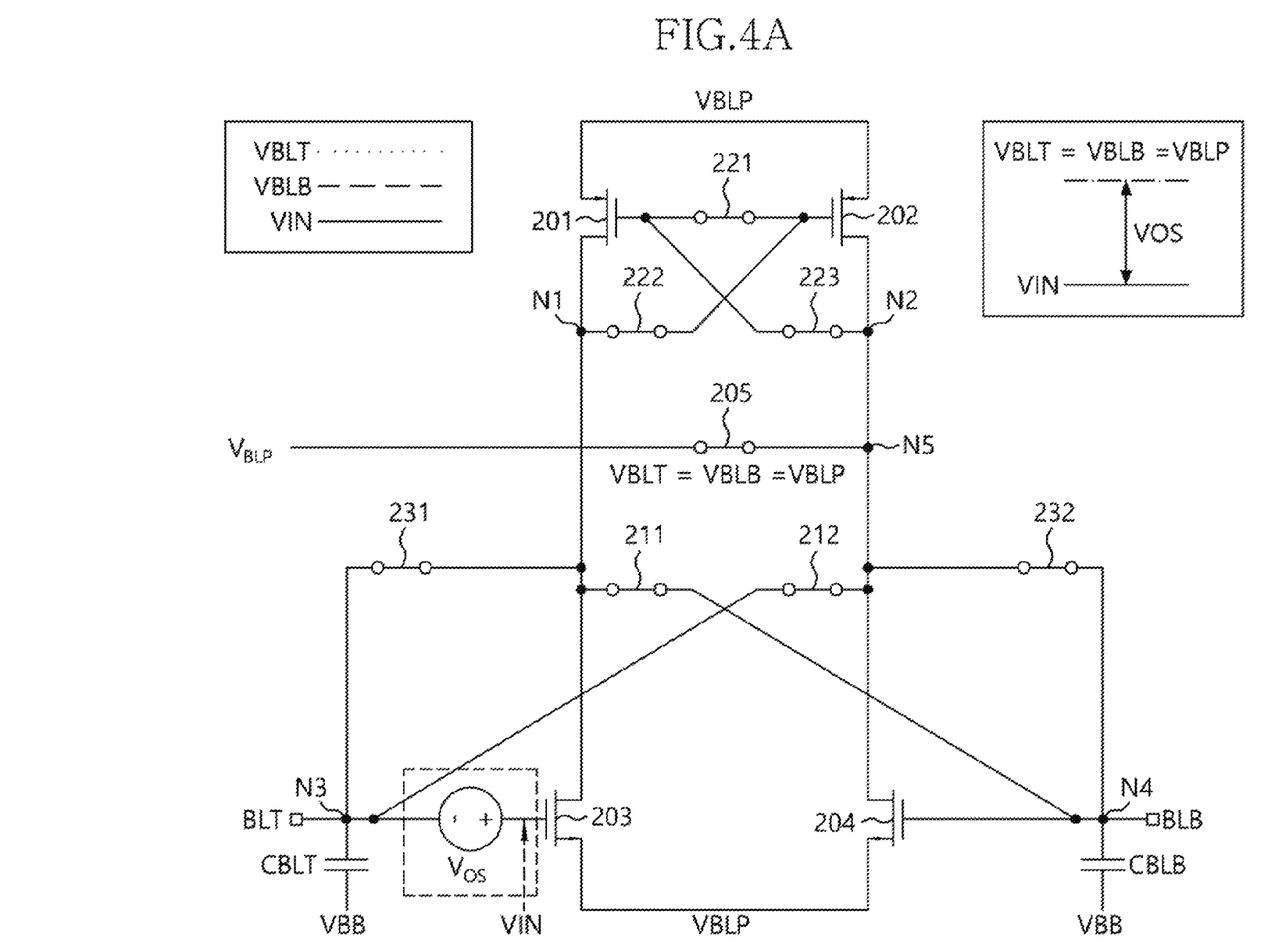
FIGS. 4A, 4B, 4C, and 4D are schematic diagrams illustrating circuit connection statuses for respective operation sections in accordance with FIG. 3.

Hereinafter, described with reference to FIGS. 3 and 4A will be the equalization section Equalization.

Within the equalization section Equalization, all of the signals BLEQ, SAON, SAOP, PMBLT, PMBLB, FBBLT, and FBBLB may have a high level.

Because all of the signals BLEQ, SAON, SAOP, PMBLT, PMBLB, FBBLT, and FBBLB have a high level, the third switching element 203 and the sixth to twelfth switching elements 211, 212, 221, 222, 223, 231, and 232 may be turned on; and thus the first voltage VRTO and the second voltage VSB may have the same voltage level as the precharge voltage VBLP.

Also, a voltage level (hereinafter, referred to as a first data line voltage VBLT) of the first bit line BLT and a voltage level (hereinafter, referred to as a second data line voltage VBLB) of the second bit line BLB may be the same as the precharge voltage VBLP.

However, each of the first data line voltage VBLT and the second data line voltage VBLB may have a voltage level difference corresponding to a first offset voltage VOS from an input voltage IN of the gate of the third switching element 203.

The first offset voltage VOS may depend on various factors such as change of fabrication process, usage of a power voltage having a low voltage level and decrease of capacitance of a capacitor configuring a unit memory cell.

Figure 4B:
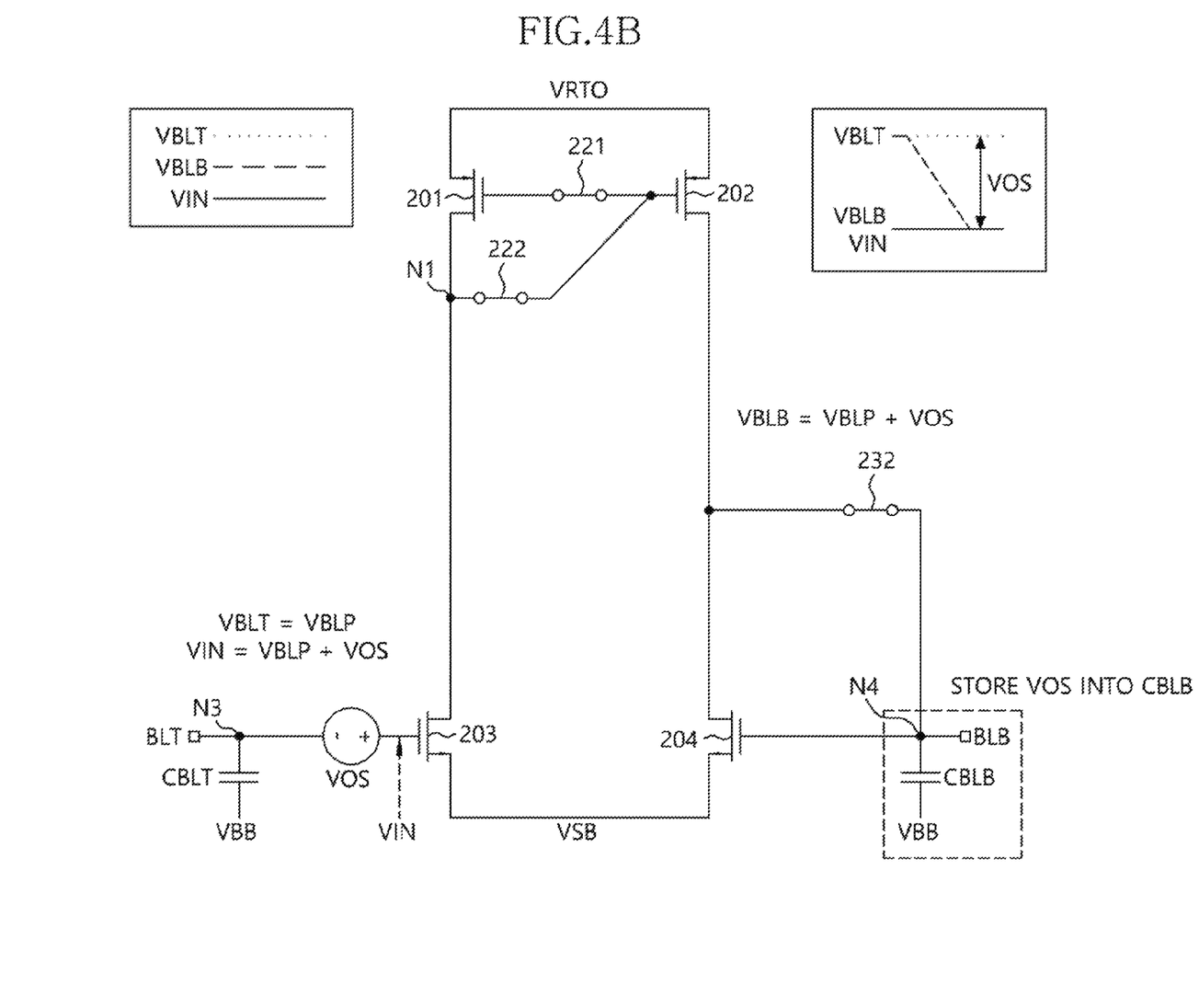

Hereinafter, described with reference to FIGS. 3 and 4B will be the offset sampling section Offset sampling.

Within the offset sampling section Offset sampling, each of the signals PMBLT, FBBLB, and SAOP may have a high level and each of the other signals may have a low level, among the signals BLEQ, SAON, SAOP, PMBLT, PMBLB, FBBLT, and FBBLB.

Because each of the signals PMBLT, FBBLB, and SAOP has a high level, the eighth, ninth and twelfth switching elements 221, 222, and 232 may be turned on; and the sixth, seventh, tenth and eleventh switching elements 211, 212, 223, and 231 may be turned off.

The first data line voltage VBLT may have the same voltage level as the precharge voltage VBLP; and the input voltage IN may have a voltage level corresponding to a sum of the voltage levels of the precharge voltage VBLP and the first offset voltage VOS.

As the eighth, ninth and twelfth switching elements 221, 222, and 232 are turned on, the sense amp 200 may operate as a single-ended amplifier and the fourth node N4 electrically coupled to the deactivated second bit line BLB may be an output node of the single-ended amplifier.

As the fourth node N4 electrically coupled to the deactivated second bit line BLB becomes the output node of the single-ended amplifier, the second data line voltage VBLB may have a voltage level corresponding to a sum of the precharge voltage VBLP and the first offset voltage VOS.

The second parasitic capacitor CBLB of the second bit line BLB may store a voltage corresponding to voltage difference between the second data line voltage VBLB and the first data line voltage VBLT, that is, a voltage corresponding to the first offset voltage VOS.

Here, the voltage stored in the second parasitic capacitor CBLB is referred to as a second offset voltage.

Within the above described equalization section Equalization and the offset sampling section Offset sampling, the word lines of the unit memory blocks 11 and 12 may be deactivated.

Figure 4C:
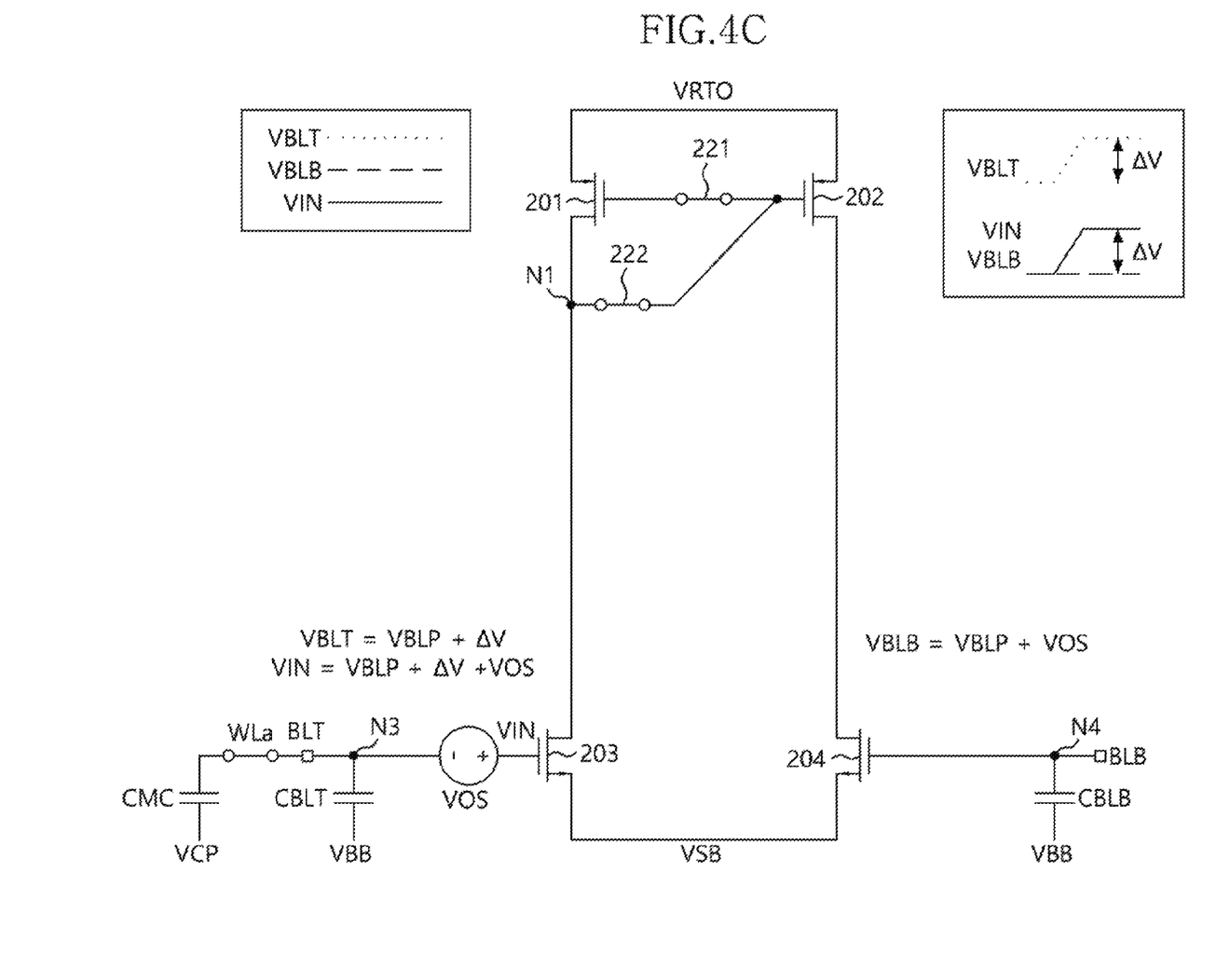

Hereinafter, described with reference to FIGS. 3 and 4C will be the charge sharing section Charge Sharing.

Within the charge sharing section Charge Sharing, each of the signals PMBLT and SAOP may have a high level and each of the other signals may have a low level, among the signals BLEQ, SAON, SAOP, PMBLT, PMBLB, FBBLT, and FBBLB.

Within the charge sharing section Charge Sharing, the word lines WLa may become activated and thus a substrate voltage VCP and a voltage of a capacitor CMC of a memory cell electrically coupled to the word line WLa may be applied to the sense amp 200.

Because each of the signals PMBLT and SAOP has a high level, the eighth and ninth switching elements 221 and 222 may be turned on; and the sixth, seventh, tenth, eleventh and twelfth switching elements 211, 212, 223, 231, and 232 may be turned off.

Through the charge sharing operation, the first data line voltage VBLT may change by an amount of 'AV' due to the precharge voltage VBLP and the input voltage IN may have a voltage level corresponding to a sum of the precharge voltage VBLP, the 'AV' and the first offset voltage VOS.

The second data line voltage VBLB may have a voltage level corresponding to a sum of the precharge voltage VBLP and the first offset voltage VOS due to the second offset voltage stored during the offset sampling section Offset sampling.

Therefore, the first offset voltage VOS included in the input voltage IN may be cancelled by the second offset voltage included in the second data line voltage VBLB.

Figure 4D:
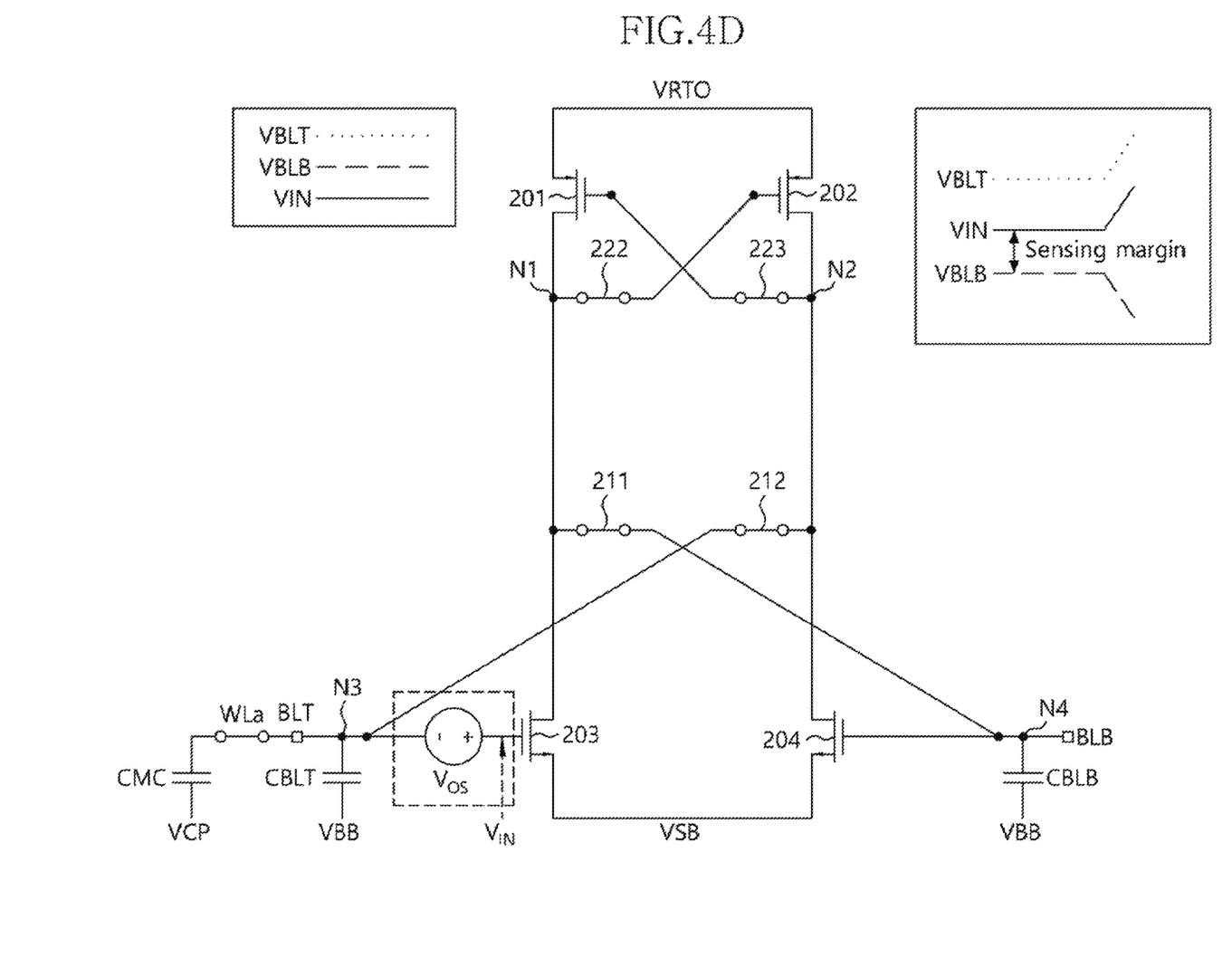

Hereinafter, described with reference to FIGS. 3 and 4D will be the sensing/amplification section SA operation.

Within the sensing/amplification section SA operation, each of the signals PMBLT, PMBLB, and SAON may have a high level and each of the other signals may have a low level, among the signals BLEQ, SAON, SAOP, PMBLT, PMBLB, FBBLT, and FBBLB.

Within the sensing/amplification section SA operation, because the word line WLa may keep activated and each of the signals PMBLT, PMBLB and SAON may have a high level, the sixth, seventh, ninth and tenth switching elements 211, 212, 222, and 223 may be turned on; and the eighth, eleventh and twelfth switching elements 221, 231, and 232 may be turned off.

The sense amp 200 may change one between the input voltage IN and the second data line voltage VBLB to a voltage level of the first voltage VRTO and may change the other one between the input voltage IN and the second data line voltage VBLB to a voltage level of the second voltage VSB, by amplifying the 'AV' generated by the previous charge sharing operation.

Here, the offset voltage is cancelled during the above described charge sharing operation and thus the sensing margin in the sensing/amplification operation may increase drastically when compared with a case of existence of the offset voltage.

Figure 5:
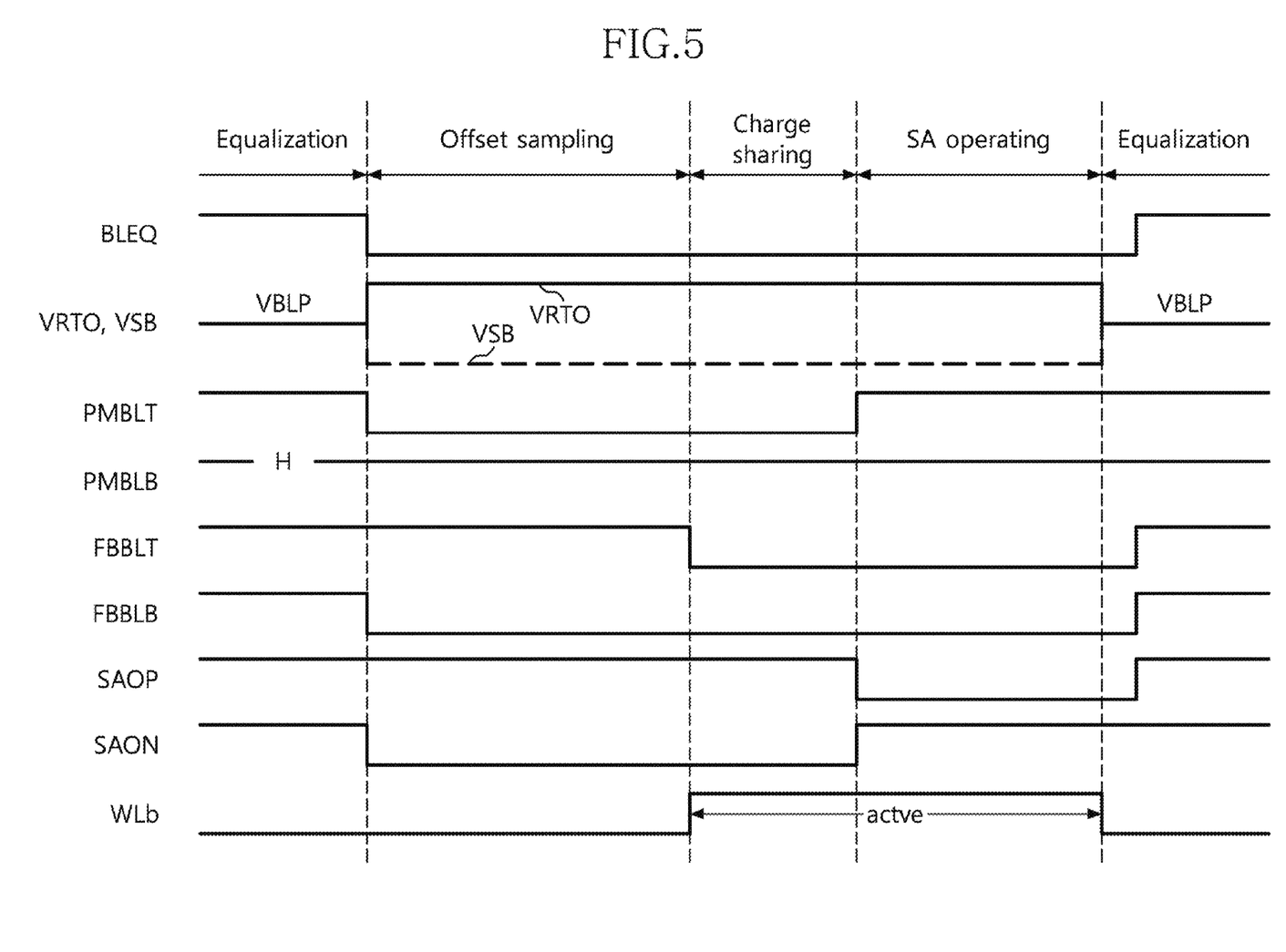
FIG. 5 is a timing diagram illustrating an operation of a data sensing circuit in accordance with an embodiment of the present disclosure.

FIG. 5 is a timing diagram illustrating an operation of a data sensing circuit in accordance with an embodiment of the present disclosure; and FIGS. 6A to 6D are schematic diagrams illustrating circuit connection statuses for respective operation sections in accordance with FIG. 5.

FIG. 5 illustrates changes of the plurality of control signals CTRL within the respective sections when the unit memory block 11 is activated between the unit memory blocks 11 and 12 illustrated in FIG. 1 (i.e., when the second bit line BLB is activated).

When comparing FIG. 5 with FIG. 3, the embodiment illustrated in FIG. 5 differs from the embodiment illustrated in FIG. 3 in that: the first parasitic capacitor CBLT of the first bit line BLT may store, during the offset sampling section Offset sampling, a voltage corresponding to voltage difference between the second data line voltage VBLB and the first data line voltage VBLT, that is, a voltage corresponding to the first offset voltage VOS; and the offset voltage included in the input voltage IN may be cancelled by the offset voltage stored in the first parasitic capacitor CBLT during the charge sharing section Charge Sharing.

In order to adjust the circuit configuration of the sense amp 200 to perform the above described operation, the sense amp control circuit 500 may generate control signals illustrated in FIG. 5.

Figure 6A:
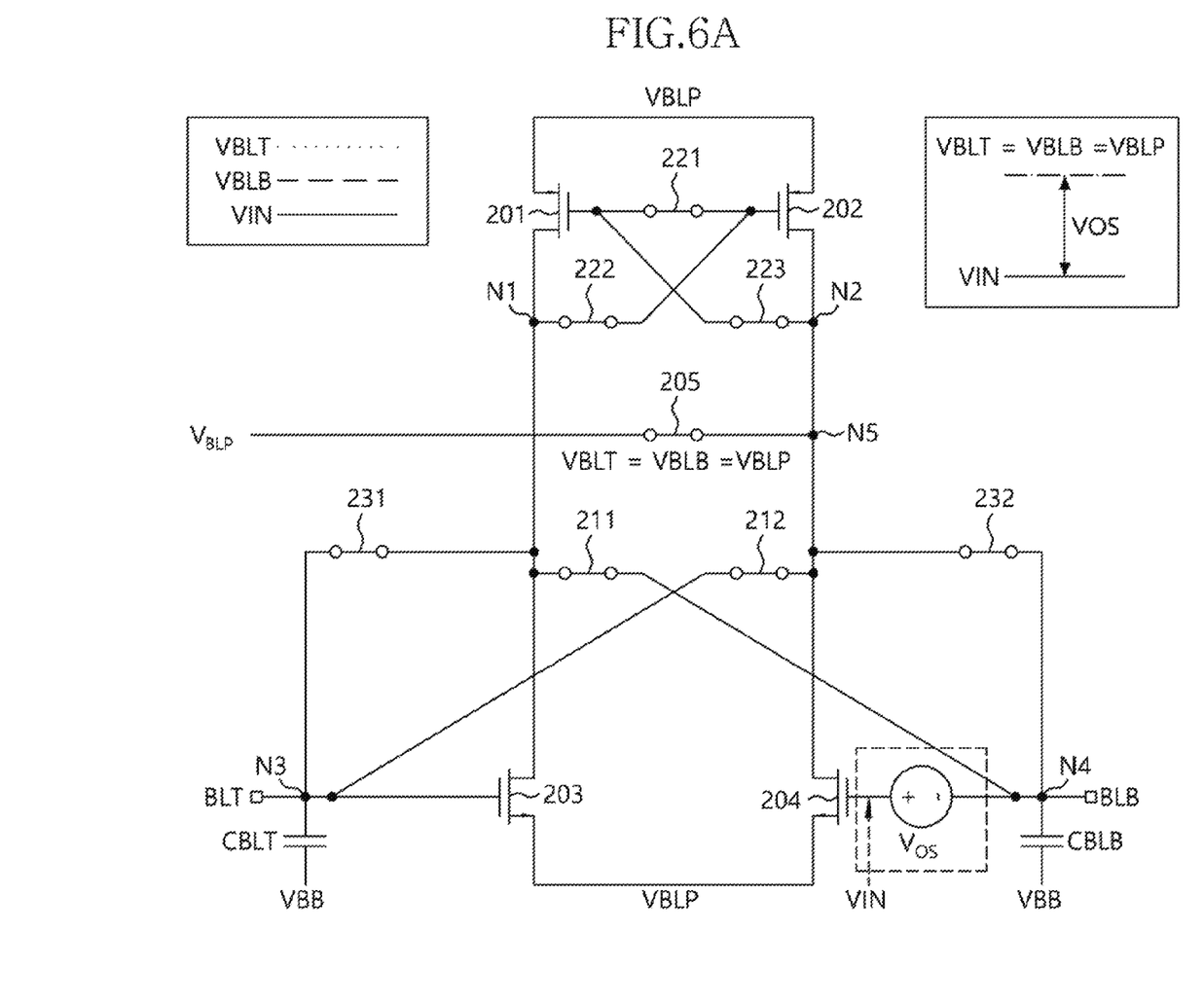
FIGS. 6A, 6B, 6C, and 6D are schematic diagrams illustrating circuit connection statuses for respective operation sections in accordance with FIG. 5.
Figure 6B:
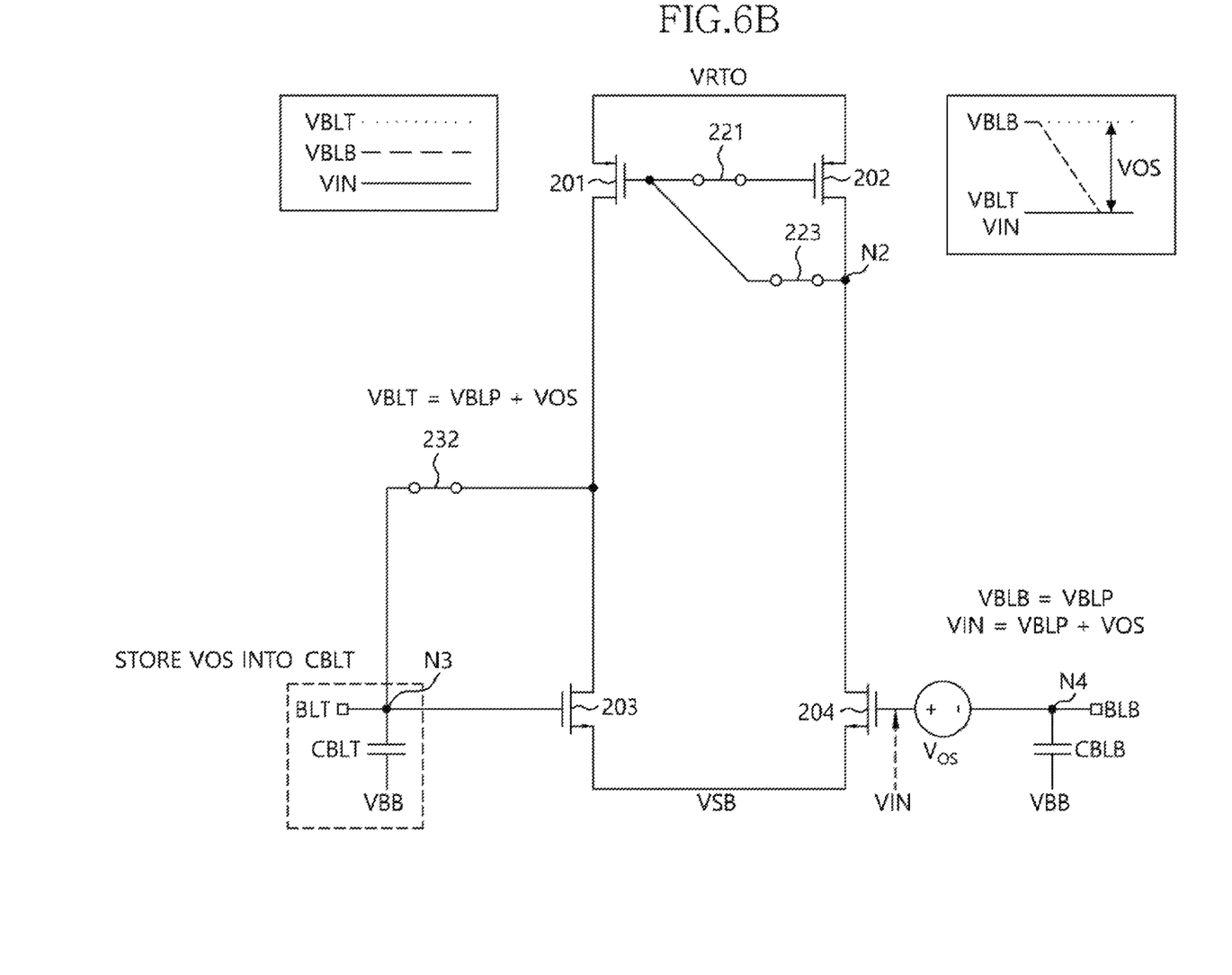
Figure 6C:
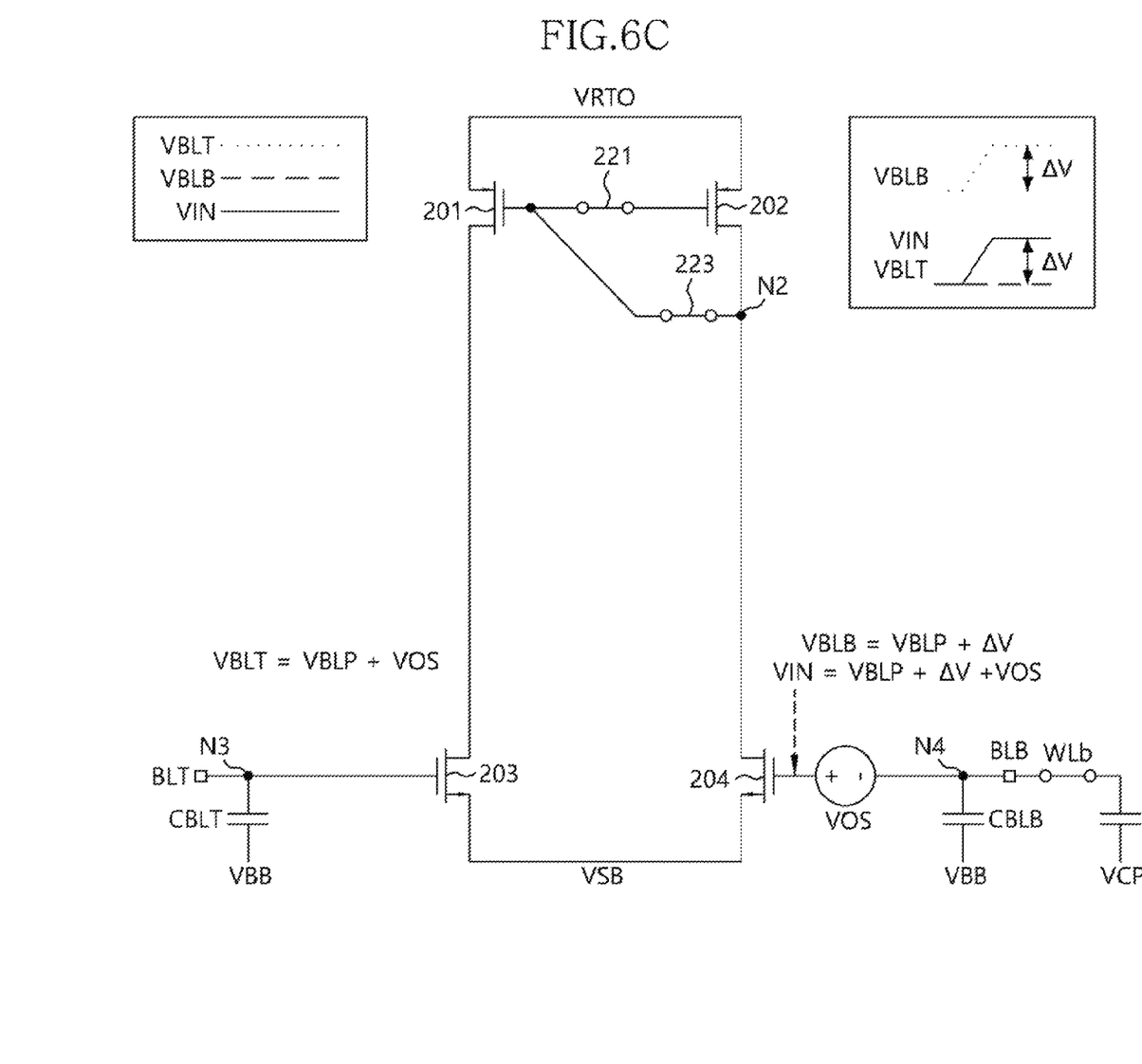
Figure 6D:
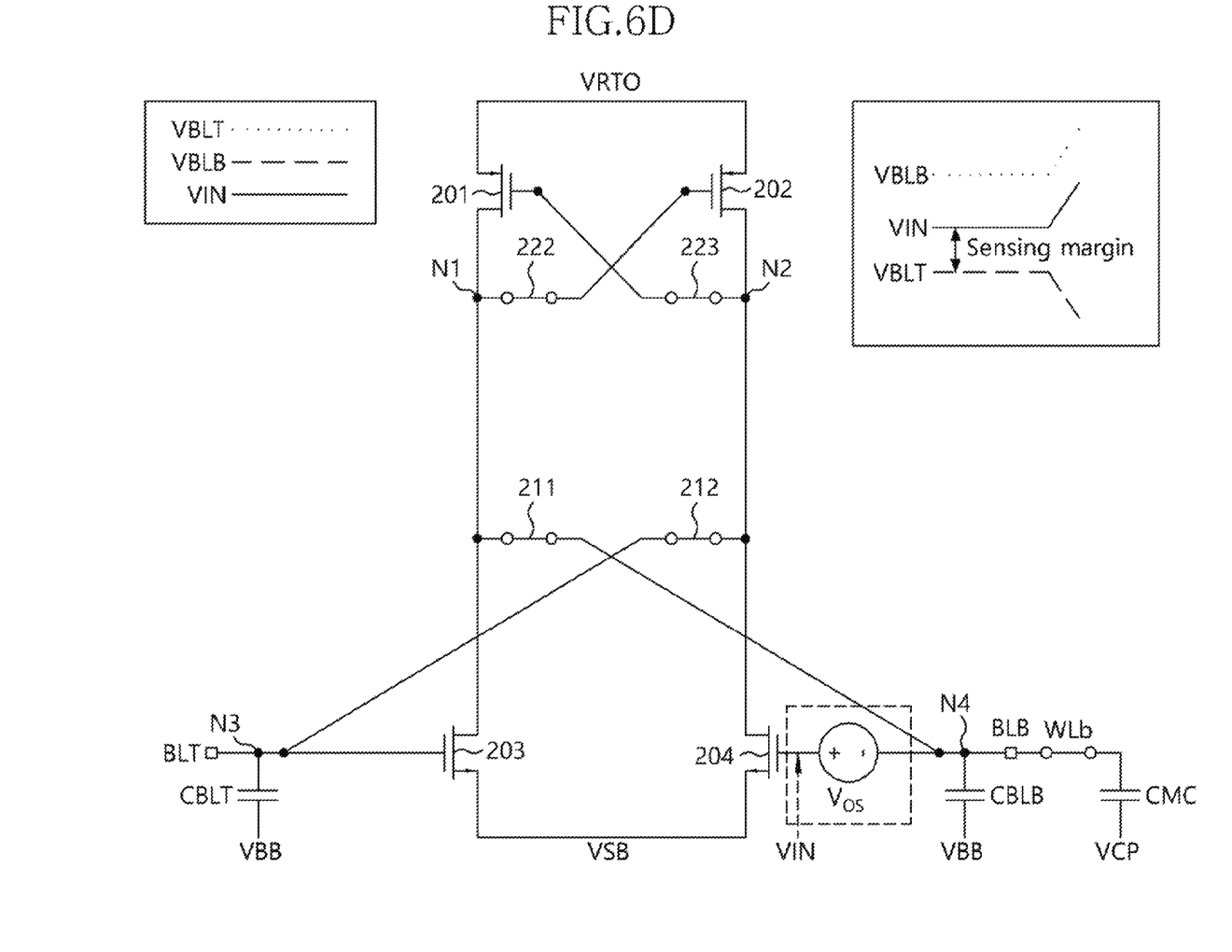

Hereinafter, described with reference to FIGS. 5 to 6D will be an operation of the data sensing circuit 100 in accordance with an embodiment of the present disclosure.

When the second bit line BLB is activated, the deactivated first bit line BLT may be utilized as a reference for sensing and amplifying a voltage level of the second bit line BLB.

Hereinafter, described with reference to FIGS. 5 and 6A will be the equalization section Equalization.

Within the equalization section Equalization, all of the signals BLEQ, SAON, SAOP, PMBLT, PMBLB, FBBLT, and FBBLB may have a high level.

Because all of the signals BLEQ, SAON, SAOP, PMBLT, PMBLB, FBBLT, and FBBLB have a high level, the third switching element 203 and the sixth to twelfth switching elements 211, 212, 221, 222, 223, 231, and 232 may be turned on; and thus the first voltage VRTO and the second voltage VSB may have the same voltage level as the precharge voltage VBLP.

Also, the first data line voltage VBLT and the second data line voltage VBLB may be the same as the precharge voltage VBLP.

However, each of the first data line voltage VBLT and the second data line voltage VBLB may have a voltage level difference corresponding to the first offset voltage VOS from the input voltage IN of the gate of the fourth switching element 204.

The first offset voltage VOS may depend on various factors such as change of fabrication process, usage of a power voltage having a low voltage level and decrease of capacitance of a capacitor configuring a unit memory cell.

Hereinafter, described with reference to FIGS. 5 and 6B will be the offset sampling section Offset sampling.

Within the offset sampling section Offset sampling, each of the signals PMBLB, FBBLT, and SAOP may have a high level and each of the other signals may have a low level, among the signals BLEQ, SAON, SAOP, PMBLT, PMBLB, FBBLT, and FBBLB.

Because each of the signals PMBLB, FBBLT, and SAOP has a high level, the eighth, tenth, and eleventh switching elements 221, 223 and 231 may be turned on; and the sixth, seventh, ninth and twelfth switching elements 211, 212, 222, and 232 may be turned off.

The first data line voltage VBLT may have the same voltage level as the precharge voltage VBLP; and the input voltage IN may have a voltage level corresponding to a sum of the voltage levels of the precharge voltage VBLP and the first offset voltage VOS.

As the eighth, tenth and eleventh switching elements 221, 223, and 231 are turned on, the sense amp 200 may operate as a single-ended amplifier and the third node N3 electrically coupled to the deactivated first bit line BLT may be an output node of the single-ended amplifier.

As the third node N3 electrically coupled to the deactivated first bit line BLT becomes the output node of the single-ended amplifier, the first data line voltage VBLT may have a voltage level corresponding to a sum of the precharge voltage VBLP and the first offset voltage VOS.

The first parasitic capacitor CBLT of the first bit line BLT may store a voltage corresponding to voltage difference between the second data line voltage VBLB and the first data line voltage VBLT, that is, a voltage corresponding to the first offset voltage VOS.

Here, the voltage stored in the first parasitic capacitor CBLT is referred to as a second offset voltage.

Within the above described equalization section Equalization and the offset sampling section Offset sampling, the word lines of the unit memory blocks 11 and 12 may be deactivated.

Hereinafter, described with reference to FIGS. 5 and 6C will be the charge sharing section Charge Sharing.

Within the charge sharing section Charge Sharing, each of the signals PMBLB and SAOP may have a high level and each of the other signals may have a low level, among the signals BLEQ, SAON, SAOP, PMBLT, PMBLB, FBBLT, and FBBLB.

Within the charge sharing section Charge Sharing, the word lines WLb may become activated and thus a substrate voltage VCP and a voltage of a capacitor CMC of a memory cell electrically coupled to the word line WLb may be applied to the sense amp 200.

Because each of the signals PMBLB and SAOP has a high level, the eighth and tenth switching elements 221 and 223 may be turned on; and the sixth, seventh, ninth, eleventh, and twelfth switching elements 211, 212, 222, 231, and 232 may be turned off.

Through the charge sharing operation, the second data line voltage VBLB may change by an amount of 'AV' due to the precharge voltage VBLP and the input voltage IN may have a voltage level corresponding to a sum of the precharge voltage VBLP, the 'AV' and the first offset voltage VOS.

The first data line voltage VBLT may have a voltage level corresponding to a sum of the precharge voltage VBLP and the first offset voltage VOS due to the second offset voltage stored during the offset sampling section Offset sampling.

Therefore, the first offset voltage VOS included in the input voltage IN may be cancelled by the second offset voltage included in the first data line voltage VBLT.

Hereinafter, described with reference to FIGS. 5 and 6D will be the sensing/amplification section SA operation.

Within the sensing/amplification section SA operation, each of the signals PMBLT, PMBLB and SAON may have a high level and each of the other signals may have a low level, among the signals BLEQ, SAON, SAOP, PMBLT, PMBLB, FBBLT, and FBBLB.

Within the sensing/amplification section SA operation, because the word line WLb may keep activated and each of the signals PMBLT, PMBLB and SAON may have a high level, the sixth, seventh, ninth, and tenth switching elements 211, 212, 222, and 223 may be turned on; and the eighth, eleventh, and twelfth switching elements 221, 231, and 232 may be turned off.

The sense amp 200 may change one between the input voltage IN and the first data line voltage VBLT to a voltage level of the first voltage VRTO and may change the other one between the input voltage IN and the first data line voltage VBLT to a voltage level of the second voltage VSB, by amplifying the 'AV' generated by the previous charge sharing operation.

Here, the offset voltage is cancelled during the above described charge sharing operation and thus the sensing margin in the sensing/amplification operation may increase when compared with a case of existence of the offset voltage.

While a limited number of possible embodiments have been described above, it will be understood to those skilled in the art that the presented embodiments represent examples only. Accordingly, the data sensing circuit of semiconductor apparatus should not be limited based on the described embodiments. Rather, the data sensing circuit of semiconductor apparatus described herein should only be considered in light of the claims that follow when taken in conjunction with the above description and accompanying drawings.

What is claimed is:

1. A data sensing circuit of a semiconductor apparatus, the data sensing circuit comprising:
    a sensing portion configured to sense and amplify an input signal provided through an activated data line between a first data line and a second data line; and
    an offset sampling portion configured to:
        generate a second offset voltage by sampling a first offset voltage of one to be activated between the first data line and the second data line; and
        store the second offset voltage into a parasitic capacitor of the other one between the first data line and the second data line.

2. The data sensing circuit of a semiconductor apparatus of claim 1, wherein the data sensing circuit is configured such that the first offset voltage is cancelled by the second offset voltage during a charge sharing operation of the data sensing circuit.

3. The data sensing circuit of a semiconductor apparatus of claim 1, wherein the first data line and the second data line are bit lines electrically coupled to one and the other one between unit memory blocks of the semiconductor apparatus, respectively.

4. A data sensing circuit of a semiconductor apparatus, the data sensing circuit comprising:
    a sense amp configured to:
        generate a second offset voltage by sampling a first offset voltage of one to be activated between a first data line and a second data line;
        store the second offset voltage into the other one between the first data line and the second data line; and
        control the first offset voltage and the second offset voltage such that the first offset voltage is cancelled by the second offset voltage, in response to a plurality of control signals; and
    a sense amp control circuit configured to generate the plurality of control signals in response to an activation information defining one to be activated between the first data line and the second data line.

5. The data sensing circuit of a semiconductor apparatus of claim 4, wherein the data sensing circuit is configured such that the first offset voltage is cancelled by the second offset voltage during a charge sharing operation of the sense amp.

6. The data sensing circuit of a semiconductor apparatus of claim 4, wherein the sense amp comprises:
    a sensing portion configured to sense and amplify an input signal provided through an activated one between the first data line and the second data line; and
    an offset sampling portion configured to:
        generate the second offset voltage by sampling the first offset voltage; and
        store the second offset voltage into a parasitic capacitor of the other one between the first data line and the second data line.

7. The data sensing circuit of a semiconductor apparatus of claim 4, wherein the first data line and the second data line are bit lines electrically coupled to one and the other one between unit memory blocks of the semiconductor apparatus, respectively.

* * * * *